(12) United States Patent
Sugio

(10) Patent No.: US 7,570,091 B2
(45) Date of Patent: Aug. 4, 2009

(54) POWER-ON RESET CIRCUIT

(75) Inventor: Kenichirou Sugio, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 27 days.

(21) Appl. No.: 11/983,604

(22) Filed: Nov. 9, 2007

(65) Prior Publication Data

US 2008/0116945 A1   May 22, 2008

(30) Foreign Application Priority Data

Nov. 20, 2006   (JP)   ............................. 2006-312538

(51) Int. Cl.
*H03L 7/00* (2006.01)
(52) U.S. Cl. .......................... 327/143; 327/80; 327/142
(58) Field of Classification Search ................. 327/142, 327/143, 198, 78, 80, 81
See application file for complete search history.

(56) References Cited

U.S. PATENT DOCUMENTS 6,566,919 B2 * 5/2003 Nguyen ....................... 327/143

FOREIGN PATENT DOCUMENTS

JP   2005-159996   6/2005

\* cited by examiner

*Primary Examiner*—Long Nguyen
(74) *Attorney, Agent, or Firm*—Taft Stettinius & Hollister LLP (57) ABSTRACT

A determination unit of a power-on reset circuit of a semiconductor integrated circuit is provided that ANDs (1) a first monitoring signal output from a first monitoring unit for monitoring when a first source voltage supplied from outside the semiconductor integrated circuit reaches a predetermined level and (2) a second monitoring signal output from a second monitoring unit for monitoring when an internal source voltage reaches a predetermined level, to produce a reset signal. In the determination unit, a first PMOS is inserted in series with a second PMOS connected between the first source voltage and a node. The conducting state of the second PMOS is controlled by the second monitoring signal. The conducting state of the first PMOS is controlled by the reset signal. Thus, even when the second monitoring signal becomes unstable and the second PMOS and a first NMOS are simultaneously turned on, the first PMOS is turned off, thus causing no flow of through current.

20 Claims, 6 Drawing Sheets

PRIOR ART

Fig. 3

PRIOR ART

POWER-ON RESET CIRCUIT

CROSS-REFERENCE TO RELATED APPLICATIONS

This application is a claims priority under 35 U.S.C. §119 to Japanese Patent Application Serial No. JP2006-312538 filed on Nov. 20, 2006, entitled "Power-on reset circuit," the disclosure of which is hereby incorporated by reference.

FIELD OF THE INVENTION

The present invention is directed to a power-on reset circuit for monitoring the rising edge of a power source and setting an internal circuit to a reset state until the power source rises to a predetermined level.

BACKGROUND

Figure 2:
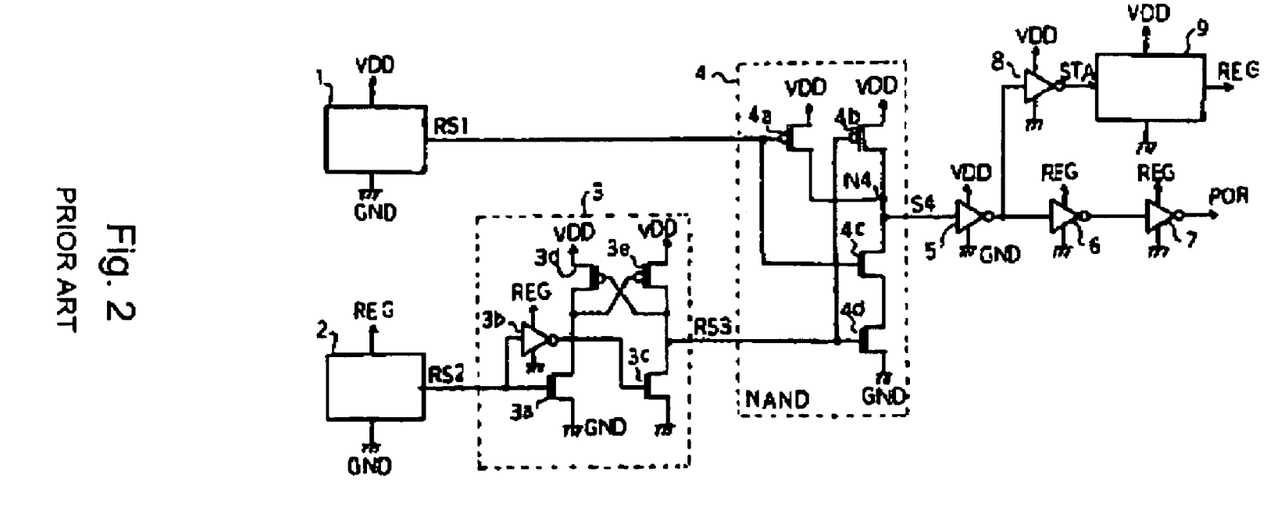
FIG. 2 is a configuration diagram of a prior art power-on reset circuit.
Figure 3:
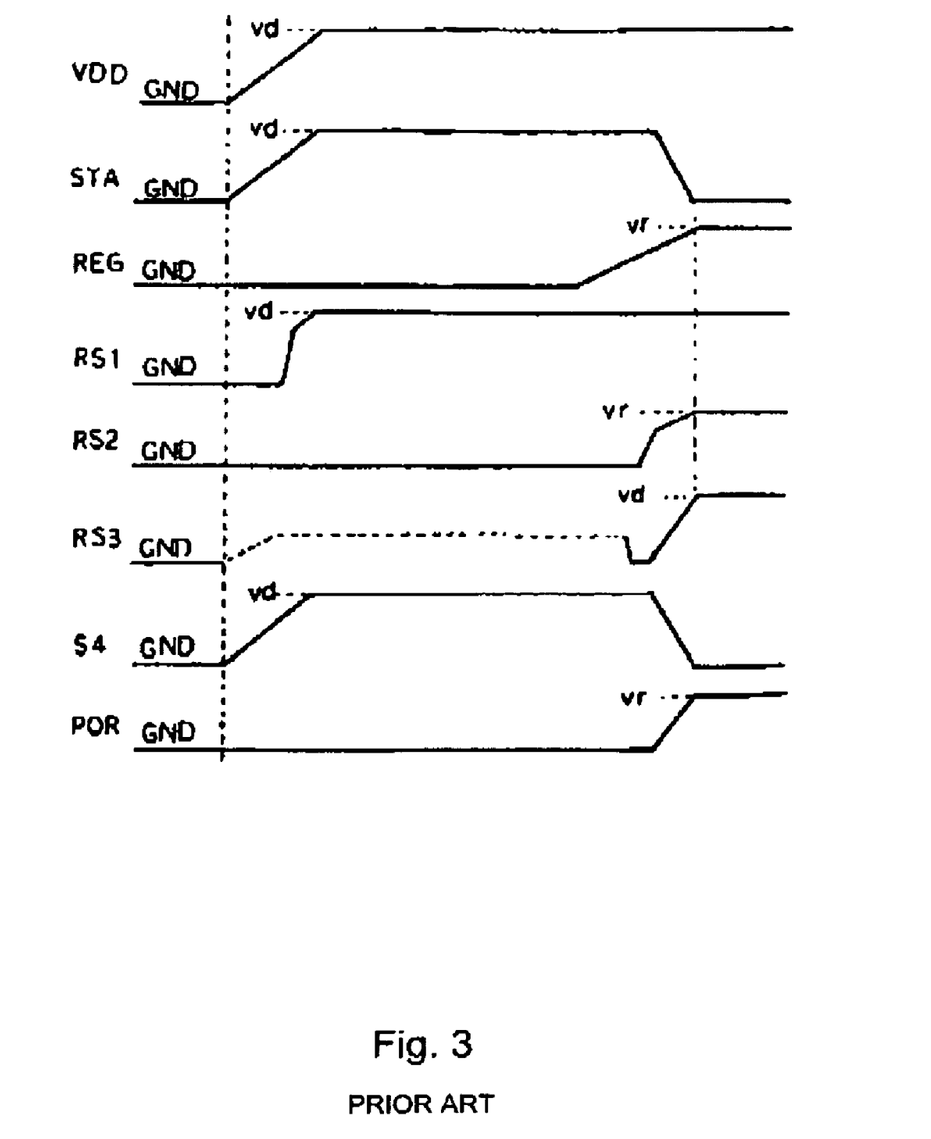
FIG. 3 is a signal waveform diagram showing operation of the power-on reset circuit of FIG. 2.

Referring to FIGS. 2 and 3, conventional power-on reset circuits are accompanied by problems in that the level of the input signal of the NAND 4 becomes instable during the period in which the source voltage REG outputted from the voltage regulator 9 is rising after the source voltage VDD has risen, whereby the through current flows from the source voltage VDD to the ground potential GND.

That is, the normal source voltage REG is not supplied to the monitoring unit 2 and to the inverter 3b as part of the level shifter 3 during the rise-up period up of the source voltage REG after the source voltage VDD has risen. Accordingly, the reset signal RS2 outputted from the monitoring unit 2 and the output signal of the inverter 3b are both brought to "L". As a result, the NMOSs 3a and 3c are respectively brought to an off state during this period, so that the level of the reset signal RS3 outputted from the level shifter 3 becomes unstable.

Since the source voltage VDD has risen in this state, the reset signal RS1 is brought to "H", and the PMOS 4a is turned off and the NMOS 4c is turned on. On the other hand, there is a fear that when the reset signal RS3 becomes unstable, the PMOS 4b and NMOS 4d are turned on simultaneously. This would result in the through current flowing from the source voltage VDD to the ground potential GND via the PMOS 4b and NMOSs 4c and 4d. Accordingly, there was a fear that a failure in operation would be incurred due to aged deterioration with the flow of the through current at each power-on.

SUMMARY

The present inventions aims to prevent such a through current in a power-on reset circuit adapted to two types of source voltages. The present invention provides a power-on reset circuit of a semiconductor integrated circuit, where the semiconductor integrated circuit has a first internal circuit operated at first a source voltage supplied from outside the semiconductor integrated circuit (such as VDD). The power-on reset circuit supplies a power-on reset signal (POR) at startup thereof to a second internal circuit operated at a second source voltage (such as REG) generated from the first source voltage. A determination unit of the power-on reset circuit of a semiconductor integrated circuit is provided that ANDs (1) a first monitoring signal output from a first monitoring unit for monitoring when the first source voltage reaches a predetermined level and (2) a second monitoring signal output from a second monitoring unit for monitoring when the second internal source voltage reaches a predetermined level, to produce a reset signal. In the determination unit, a first PMOS is inserted in series with a second PMOS connected between the first source voltage and a node. The conducting state of the second PMOS is controlled by the second monitoring signal. The conducting state of the first PMOS is controlled by the reset signal. Thus, even when the second monitoring signal becomes unstable and the second PMOS and a first NMOS are simultaneously turned on, the first PMOS is turned off, thus causing no flow of through current.

More specifically, the power-on reset circuit includes a first monitoring unit that outputs a first monitoring signal for releasing the first internal circuit from a reset state when the first source voltage reaches a predetermined level; a second monitoring unit that outputs a second monitoring signal when the second internal source voltage reaches a predetermined level; a determination unit, which is operated at the first source voltage, that outputs a reset signal when the first and second monitoring signals are outputted by the first and second monitoring units; and an output unit which is operated at the second internal source voltage and which converts the reset signal to the level of the second internal source voltage and outputs this converted signal as the power-on reset signal. The determination unit includes a first PMOS which is connected between the first source voltage and an internal node and whose conducting state is controlled by the first monitoring signal; second and third PMOSs which are connected in series between the first source voltage and the internal node and whose conducting states are respectively controlled by the reset signal and the second monitoring signal; first and second NMOSs which are connected in series between the internal node and a ground potential and whose conducting states are respectively controlled by the first and second monitoring signals; and an inverter which outputs a reset signal by inverting a signal at the internal node.

In such a power-on reset circuit, a second PMOS is inserted in series with a third PMOS connected between the first source voltage and an internal node (where the third PMOS's conducting state is controlled by the second monitoring signal), and the second PMOS is controlled by the reset signal generated by the determination unit. Thus, an advantageous effect is brought about in that even when the second monitoring signal becomes unstable and the third PMOS and a second NMOS are thereby turned on simultaneously, the second PMOS is turned off, thus causing no flow of through current.

Thus, it is a first aspect of the present invention to provide a power-on reset circuit of a semiconductor integrated circuit, where the semiconductor integrated circuit has a first internal circuit operated at first a source voltage supplied from outside the semiconductor integrated circuit and has the power-on reset circuit which supplies a power-on reset signal at startup thereof to a second internal circuit operated at a second source voltage generated from the first source voltage. The power-on reset circuit includes: a first monitoring unit configured to output a first monitoring signal when the first source voltage reaches a predetermined level; a second monitoring unit configured to output a second monitoring signal when the second source voltage reaches a predetermined level; a determination unit, which is operated at the first source voltage and is operatively coupled to outputs of the first and second monitoring units, configured to output a reset signal when the first and second monitoring signals are outputted respectively by the first and second monitoring units; and an output unit which is operated at the second internal source voltage and operatively coupled to an output of the determination unit, and configured to convert the reset signal to the level of the second internal source voltage and further configured to output the converted reset signal as the power-on reset signal. The determination unit includes: a first P channel MOS transistor which is connected between the first source voltage and an internal node and whose gate terminal is operatively coupled to and controlled by the first monitoring signal output of the first monitoring unit; second and third P channel MOS transistors which are connected in series between the source voltage and the internal node and whose gate terminals are respectively operatively coupled to and controlled by the reset signal output of the determination unit and the second monitoring signal output of the second monitoring unit; first and second N channel MOS transistors which are connected in series between the internal node and a ground potential and whose gate terminals are respectively operatively coupled to and controlled by the first and second monitoring signal outputs of the first and second monitoring units; and an inverter having an input operatively coupled to the internal node and configured to output the reset signal by inverting a signal at the internal node.

In a more detailed embodiment of this first aspect of the present invention, each of the gate widths of the first and second N channel MOS transistors is several times larger than the gate width of each of the first through third P channel MOS transistors. In a further detailed embodiment, each of the gate widths of the first and second N channel MOS transistors is about twenty times larger than the gate width of each of the first through third P channel MOS transistors.

In an alternate detailed embodiment of the first aspect of the present invention, the determination unit is provided with a third N channel MOS transistor connected between the internal node and the ground potential and whose gate terminal is operatively coupled to and controlled by the reset signal output of the determination unit. In a further detailed embodiment, the third N channel MOS transistor is connected in parallel to the series connected, first and second N channel MOS transistors. Also, the gate width of the third N channel MOS transistor may be substantially less than the gate width of each of the first and second N channel MOS transistors. And more specifically, the gate width of the third N channel MOS transistor is less than or equal to half the gate width of each of the first and second N channel MOS transistors.

It is a second aspect of the present invention to provide a determination circuit of a semiconductor integrated circuit, where the semiconductor integrated circuit has a first internal circuit operated at first a source voltage supplied from outside the semiconductor integrated circuit and a second internal circuit operated at a second source voltage generated from the first source voltage. The determination circuit provides a reset signal upon first and second input signals on respective first and second input signal lines being active, and includes: a first P channel MOS transistor which is connected between the first source voltage and an internal node and whose gate terminal is operatively coupled to and controlled by the first input signal line; second and third P channel MOS transistors which are connected in series between the source voltage and the internal node and whose gate terminals are respectively operatively coupled to and controlled by the reset signal output of the determination circuit and the second input signal line; first and second N channel MOS transistors which are connected in series between the internal node and a ground potential and whose gate terminals are respectively operatively coupled to and controlled by the first and second input signal lines; and an inverter having an input operatively coupled to the internal node and configured to output the reset signal by inverting a signal at the internal node. In a more detailed embodiment, each of the gate widths of the first and second N channel MOS transistors is several times larger than the gate width of each of the first through third P channel MOS transistors. In yet a further detailed embodiment, each of the gate widths of the first and second N channel MOS transistors is about twenty times larger than the gate width of each of the first through third P channel MOS transistors.

In an alternate detailed embodiment of the second aspect of the present invention, the determination unit further includes a third N channel MOS transistor connected between the internal node and the ground potential and whose gate terminal is operatively coupled to and controlled by the reset signal output of the determination unit. In yet a further detailed embodiment, the third N channel MOS transistor is connected in parallel to the series connected, first and second N channel MOS transistors. The gate width of the third N channel MOS transistor may be substantially less than the gate width of each of the first and second N channel MOS transistors. And more specifically, the gate width of the third N channel MOS transistor may be less than or equal to half the gate width of each of the first and second N channel MOS transistors.

It is a third aspect of the present invention to provide, in a semiconductor integrated circuit, and at startup of the semiconductor integrated circuit, a method for supplying a power-on reset signal to a second internal circuit operated at a second internal source voltage generated from a first source voltage supplied from outside the semiconductor integrated circuit. The method includes the steps of: monitoring the first source voltage and outputting a first monitoring signal when the first source voltage reaches a predetermined level; monitoring the second internal source voltage and outputting a second monitoring signal when the second internal source voltage reaches a predetermined level; providing a determination unit, which is operated at the first source voltage, and which outputs a reset signal when the first and second monitoring signals are outputted; and converting the reset signal to the level of the second internal source voltage and outputting the converted reset signal as the power-on reset signal. The determination unit includes: a first P channel MOS transistor which is connected between the first source voltage and an internal node, where the operation of the determination unit includes a step of controlling conducting state of the first P channel MOS transistor by the first monitoring signal; second and third P channel MOS transistors which are connected in series between the first source voltage and the internal node, where the operation of the determination unit includes the steps of controlling the conducting state of the second P channel MOS transistor by the reset signal and controlling the conducting state of the third P channel MOS transistor by the second monitoring signal; and first and second N channel MOS transistors which are connected in series between the internal node and a ground potential, where the operation of the determination unit includes the steps of controlling the conducting state of the first N channel MOS transistor with the first monitoring signal and controlling the conducting state of the second N channel MOS transistor with the second monitoring signal; and where the operation of the determination unit further includes the step of inverting a signal at the internal node to provide the reset signal. In another embodiment, the determination unit further includes a third N channel MOS transistor connected between the internal node and the ground potential and the operation of the determination unit includes the step of controlling the conducting state of the third N channel MOS transistor by the reset signal.

It is a fourth aspect of the present invention to provide power-on reset circuit of a semiconductor integrated circuit, where the semiconductor integrated circuit has a first internal circuit operated at first a source voltage supplied from outside the semiconductor integrated circuit and has the power-on reset circuit which supplies a power-on reset signal at startup thereof to a second internal circuit operated at a second source voltage generated from the first source voltage. The power-on reset circuit includes: a first means for outputting a first monitoring signal when the first source voltage reaches a predetermined level; a second means for outputting a second monitoring signal when the second source voltage reaches a predetermined level; a determination unit, which is operated at the first source voltage and is operatively coupled to outputs of the first and second monitoring means, configured to output a reset signal when the first and second monitoring signals are outputted respectively by the first and second monitoring units; and an output unit which is operated at the second internal source voltage and operatively coupled to an output of the determination unit, and configured to convert the reset signal to the level of the second internal source voltage and further configured to output the converted reset signal as the power-on reset signal. The determination unit includes: a first P channel MOS transistor which is connected between the first source voltage and an internal node and whose gate terminal is operatively coupled to and controlled by the first monitoring signal output of the first monitoring unit; second and third P channel MOS transistors which are connected in series between the source voltage and the internal node and whose gate terminals are respectively operatively coupled to and controlled by the reset signal output of the determination unit and the second monitoring signal output of the second monitoring unit; first and second N channel MOS transistors which are connected in series between the internal node and a ground potential and whose gate terminals are respectively operatively coupled to and controlled by the first and second monitoring signal outputs of the first and second monitoring units; and an inverter having an input operatively coupled to the internal node and configured to output the reset signal by inverting a signal at the internal node.

DETAILED DESCRIPTION

Exemplary embodiments of the present invention are described and illustrated below. Of course, it will be apparent to those of ordinary skill in the art that the embodiments discussed below are exemplary in nature and may be reconfigured without departing from the scope and spirit of the present invention. However, for clarity and precision, the exemplary embodiments as discussed below may include optional components, steps, methods, and features that one of ordinary skill should recognize as not being a requisite to fall within the scope of the present invention. It should also be noted that constituent elements common to the figures are respectively discussed and identified using common reference numerals.

Figure 6:
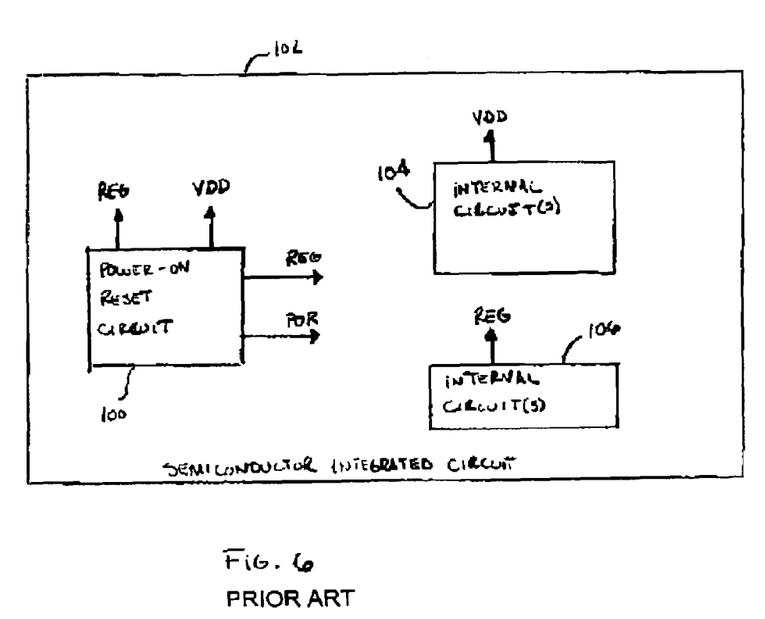
FIG. 6 is an exemplary semiconductor integrated circuit for use with both the prior art and the present invention.

Referencing FIGS. 2 and 6, a prior art power-on reset circuit 100 is adapted to accommodate two types of source voltages in a semiconductor integrated circuit 102. The first voltage is a source voltage VDD supplied from outside, while the second voltage is a source voltage REG adjusted by an internal voltage regulator. In such an exemplary semiconductor integrated circuit, the semiconductor integrated circuit includes one or more circuits 104 (which may include circuit 100) operated at the first source voltage VDD and one or more circuits 106 operated at the second source voltage REG.

The prior art power-on reset circuit has a monitoring unit 1 that monitors the rising edge of the source voltage VDD and outputs a reset signal RS1, and a monitoring unit 2 that monitors the rising edge of the source voltage REG and outputs a reset signal RS2. The monitoring units 1 and 2 are typically both identical in configuration and make use of RC time constant circuits each constituted of an electrostatic capacitance C of a capacitor and an on resistance R of a transistor. Each of the monitoring units 1 and 2 determines a voltage charged into the capacitor from the source voltage, based on a threshold value thereby to detect the rising edge of the source voltage. A level shifter 3 for converting the reset signal RS2 to the level of the source voltage VDD is connected to the output side of the monitoring unit 2.

The level shifter 3 has an N channel MOS transistor (hereinafter called "NMOS") 3a having a gate supplied with the reset signal RS2, and an NMOS 3c having a gate supplied with the reset signal inverted by an inverter 3b driven by the source voltage REG. The sources of the NMOSs 3a and 3c are connected to a ground potential GND. The drains thereof are respectively connected to the source voltage VDD via P channel MOS transistors (hereinafter "PMOSs") 3d and 3e. The gates of the PMOSs 3d and 3e are respectively connected to corresponding drains of the NMOSs 3c and 3a. The reset signal RS2 is converted to the level of the source voltage VDD through the drain of the NMOS 3c, which in turn is outputted as a reset signal RS3. The reset signals RS1 and RS3 are supplied to a negative or NOT-AND gate (hereinafter called "NAND") 4.

The NAND 4 outputs a signal S4 of a level "L" when the reset signals RS1 and RS3 are both a level "H". When one or both of the reset signals RS1 and RS2 are "L", the NAND 4 outputs a signal S4 in the form of "H". As a general configuration, the NAND 4 is constituted of PMOSs 4a and 4b parallel-connected between a node N4 from which the signal S4 is outputted, and the source voltage VDD, and NMOSs 4c and 4d connected in series between the node N4 and the ground potential GND. The gates of the PMOS 4a and NMOS 4c are supplied with the reset signal RS1, and the gates of the PMOS 4b and NMOS 4d are supplied with the reset signal RS3.

The signal S4 outputted from the NAND 4 is inverted by an inverter 5 driven by the source voltage VDD, after which it is outputted as a power-on reset signal POR via cascade-connected inverters 6 and 7 driven by the source voltage REG.

The output signal of the inverter 5 is inverted by an inverter 8 driven by the source voltage REG, after which it is supplied to a voltage regulator 9 as a start signal STA. The voltage regulator 9 adjusts the source voltage VDD supplied from outside to generate an internal source voltage REG. Incidentally, the start signal STA is of a signal for generating a reference voltage by allowing current to flow through a constant voltage circuit lying inside the voltage regulator 9 at startup.

Referring to FIG. 3, when the supply of power is started from outside, the source voltage VDD rises from the ground potential GND to a predetermined potential vd. Since the capacitors lying in the monitoring units 1 and 2 are being discharged before the start of the power supply, the reset signals RS1 and RS2 are held at the ground potential GND. Accordingly, the signal S4 outputted from the NAND 4 and the start signal STA outputted from the inverter 8 are also held at the ground potential GND.

With the rise in the source voltage VDD, the signal S4 and the start signal STA also start to rise. Since, at this time, the start signal STA does not reach such a level as to start the voltage regulator 9, no source voltage REG is outputted from the voltage regulator 9.

In the monitoring unit 1, the capacitor is charged from the source voltage VDD through the on resistance of the transistor, and the reset signal RS1 changes to "H" when the voltage of the capacitor has exceeded the threshold voltage. On the other hand, since the source voltage REG is not yet supplied to the monitoring unit 2, the reset signal RS2 remains at "L". Thus, the signal S4 outputted from the NAND 4 is of "H" and the start signal STA outputted from the inverter 8 is also of "H".

When the start signal STA rises to the level of the voltage regulator 9 with the rise in the source voltage VDD, the operation of the voltage regulator 9 is started. Thus, the source voltage REG outputted from the voltage regulator 9 starts rising.

In the monitoring unit 2, the capacitor is charged from the source voltage REG via the on resistance of the transistor, and the reset signal RS2 changes to "H" when the voltage of the capacitor has exceeded the threshold value. When the reset signal RS2 is brought to "H", the reset signal RS3 outputted from the level shifter 3 is also brought to "H", so that the signal S4 outputted from the NAND 4 is brought to "L".

Since the voltage regulator 9 is already started up although the start signal STA supplied to the voltage regulator 9 is also brought to "L" when the signal S4 goes "L", its operation is continued. On the other hand, when the signal S4 is inverted by the inverters 5 through 7 and the power-on reset signal POR outputted from the inverter 7 is brought to "H" (H of the source voltage REG). Thus, the reset state of an internal circuit (such as circuit(s) 106) operated at the source voltage REG is released so that the above operation is started under the source voltage REG having risen normally.

With such a configuration, there is a risk of a malfunction caused by source voltage REG accessing an analog circuit (or the like) operated at the source voltage VDD during source voltage REG initial rise, when the rising edge of the source voltage VDD is very slow (for example, 500 ms is taken).

Incidentally, the technique of preventing a through current at a power-on reset circuit adapted to one type of source voltage has been described in the Japanese Unexamined Patent Publication No. 2005-159996.

Figure 1:
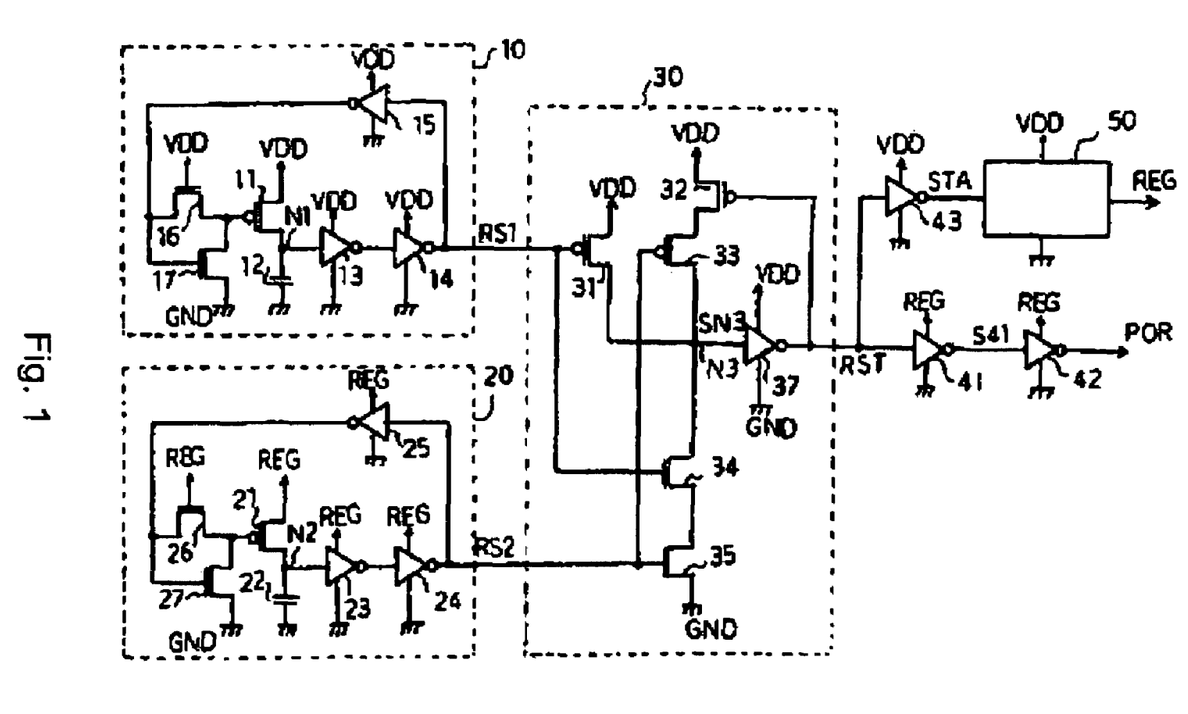
FIG. 1 is a configuration diagram of a power-on reset circuit showing a first exemplary embodiment of the present invention.

Referencing FIG. 1, an exemplary power-on reset circuit in accordance with the present invention is adapted to two types of source voltages of a source voltage VDD supplied from outside and a source voltage REG adjusted by an internal voltage regulator (where VDD>REG). The power-on reset circuit has a monitoring unit 10 which monitors the rising edge of the source voltage VDD and outputs a reset signal RS1, and a monitoring unit 20 which monitors the rising edge of the source voltage REG and outputs a reset signal RS2.

The monitoring unit 10 has a PMOS 11 connected between the source voltage VDD and a node N1, and a time constant circuit constituted of a capacitor 12 connected between the node N1 and a ground potential GND. Inverters 13, 14 and 15 driven by the source voltage VDD are cascade-connected to the node N1. The reset signal RS1 is outputted from the output side of the inverter 14.

Further, the output of the inverter 15 is connected to its corresponding gate of the PMOS 11 via an NMOS 16 and connected to its corresponding gate of an NMOS 17. The drain and source of the NMOS 17 are respectively connected to the gate of the PMOS 11 and the ground potential GND. The gate of the NMOS 16 is connected to the source voltage VDD.

The monitoring unit 20 is configured in a manner similar to the monitoring unit 10 except that it is operated by the source voltage REG. The reset signal RS2 outputted from the monitoring unit 20 is supplied to a determination unit 30 together with the reset signal RS1 outputted from the monitoring unit 10.

The determination unit 30 comprises a PMOS 31 connected between the source voltage VDD and a node N3, PMOSs 32 and 33 connected in series between the source voltage VDD and the node N3, NMOSs 34 and 35 connected in series between the node N3 and the ground potential GND, and an inverter 37 which inverts a signal SN3 of the node N3 to output a reset signal RST. The gates of the PMOS 31 and NMOS 34 are supplied with the reset signal RS1, and the gates of the PMOS 33 and NMOS 35 are supplied with the reset signal RS2. The gate of the PMOS 32 is supplied with the reset signal RST. The signal SN3 corresponding to the NANDing of the reset signals RS1 and RS2 is outputted from the node N3.

Incidentally, a relationship of dimensions (gate widths) between the PMOSs 31 through 33 and the NMOSs 34 and 35 is represented as NMOSs 34, 35>>PMOS 31≧PMOSs 32, 33. In particular, the dimensions of the NMOSs 34 and 35 are set to about twenty times the dimensions of the PMOSs 32 and 33 respectively. This is done to prevent unnecessary through current developed in the determination unit 30 due to the fact that when the dimensions of the PMOS 31 are larger than the dimensions of the NMOSs 34 and 35, current drive capacity becomes larger, so that the time required to transition the node N3 from "H" to "L" (that is, to turn off the PMOS 31 and turn on the NMOSs 34 and 35) becomes longer.

The reset signal RST is outputted as a power-on reset signal POR through cascade-connected inverters 41 and 42 of an output unit, which are driven by the source voltage REG. The reset signal RST is inverted by an inverter 43 driven by the source voltage VDD, which in turn is supplied to a voltage regulator 50 as a start signal STA. When the start signal STA is brought to "H", the voltage regulator 50 is started up to adjust the source voltage VDD supplied from outside, thereby generating an internal source voltage REG.

Figure 4:
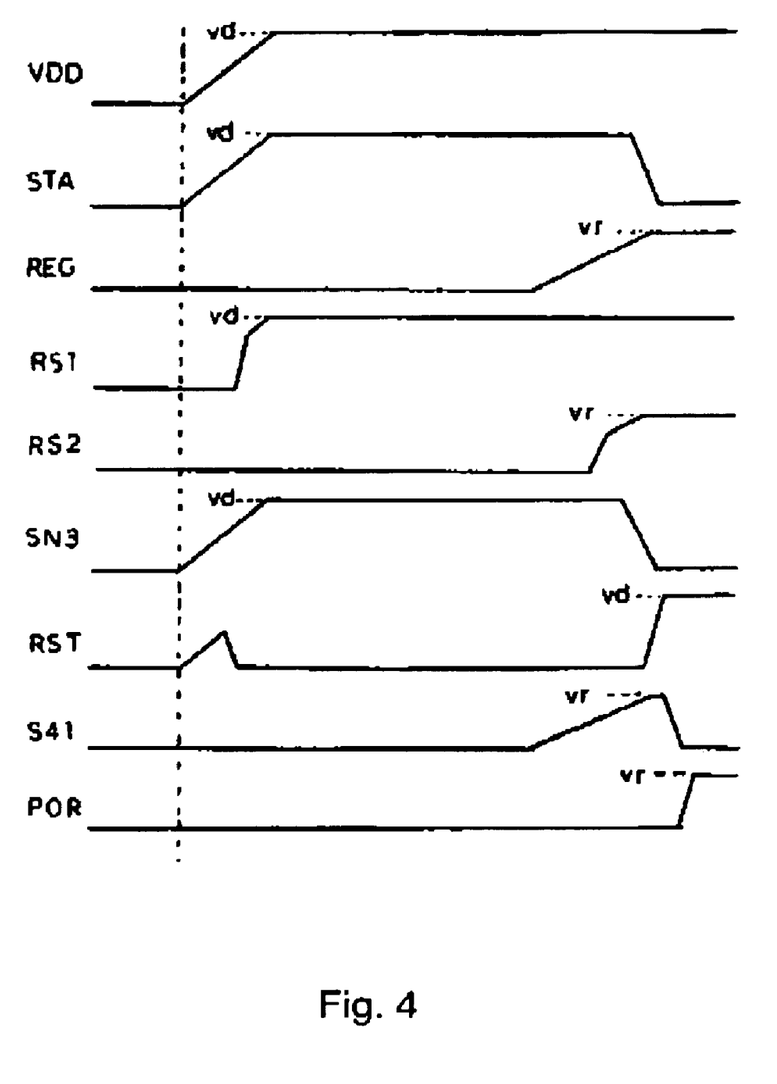
FIG. 4 is a signal waveform diagram showing operation of the first exemplary embodiment of FIG. 1.

Referring to FIG. 4, when the supply of power is started from outside, the source voltage VDD rises from the ground potential GND to a predetermined potential vd. Since the capacitors 12 and 22 lying in the monitoring units 10 and 20 are being discharged immediately after the start of the power supply, the reset signals RS1 and RS2 are held at the ground potential GND. Accordingly, the PMOSs 31 and 33 of the determination unit 30 are taken on and the NMOSs 34 and 35 are taken off. Thus, the signal SN3 of the node N3 of the determination unit 30 starts to rise with the rise in the source voltage VDD.

The reset signal RST outputted from the inverter 37 first rises with the rise in the source voltage VDD. Since, however, the signal SN3 is inverted and outputted when the source voltage VDD rises to a predetermined operating voltage, the reset signal RST is brought to "L". Thus, the PMOS 32 of the determination unit 30 is turned on.

The start signal STA outputted from the inverter 43 first rises with the rise in the source voltage VDD independent of the reset signal RST and further continues to rise in response to the reset signal RST of "L" when the source voltage VDD rises to the predetermined operating voltage. Since, at this time, the start signal STA does not reach such a level as to start the voltage regulator 50, no source voltage REG is outputted from the voltage regulator 50.

Since the NMOS 17 is held on by the output signal ("H") of the inverter 15 in the monitoring unit 10, "L" is supplied to the gate of the PMOS 11. Thus, the capacitor 12 is charged from the source voltage VDD through the on resistance of the PMOS 11, and the reset signal RS1 changes to "H" when the voltage of the node N1 has exceeded the threshold voltage of the inverter 13. On the other hand, since the source voltage REG is not supplied to the monitoring unit 20, the reset signal RS2 remains at "L".

When the reset signal RS1 is brought to "H", the PMOS 31 of the determination unit 30 is turned off and the NMOS 34 thereof is turned on. Since, however, the reset signal RS2 remains at "L", the SN3 of the node N3 remains unchanged with being held at "H".

When the level of the start signal STA rises with the rise in the source voltage VDD and reaches a start level of the voltage regulator 50, the operation of the voltage regulator 50 is started. Thus, the source voltage REG outputted from the voltage regulator 50 starts rising.

In the monitoring unit 20, the capacitor 22 is charged from the source voltage REG via the on resistance of a PMOS 21, and the reset signal RS2 changes to "H" when the voltage of the node N2 has exceeded the threshold value of the inverter 23.

Since the PMOS 33 of the determination unit 30 is turned off and the NMOS 35 thereof is turned on when the reset signal SR2 is brought to "H", the signal SN3 of the node N3 changes to "L". Thus, the reset signal RST changes to "H" so that the PMOS 32 is turned off. Since the voltage regulator 50 is already started up although the start signal STA supplied to the voltage regulator 50 is brought to "L", its operation is continued.

Further, the reset signal RST of "H" is outputted as a power-on reset signal POR via the cascade-connected inverters 41 and 42 operated by the source voltage REG. Incidentally, the level of the power-on reset signal POR corresponds to the source voltage REG. Thus, the reset state of an internal circuit (such as circuit(s) 106) operated at the source voltage REG is released, so that its operation is started under the source voltage REG having risen normally. Incidentally, the internal circuit operated at the source voltage VDD is released from its reset state in accordance with the reset signal RS1 outputted from the monitoring unit 10.

Since the power-on reset circuit of the embodiment of FIG. 1 is provided with the determination unit 30 with the combined level shift function and NANDing function as described above, it is capable of supplying a stable voltage to the gate of each transistor of the determination unit 30 even during a period up to the rising edge of the source voltage REG after the source voltage VDD has risen, and will cause no flow of through current. Accordingly, the power-on reset circuit has the advantage of causing no fear of a failure in operation due to aged deterioration caused by the through current.

Figure 5:
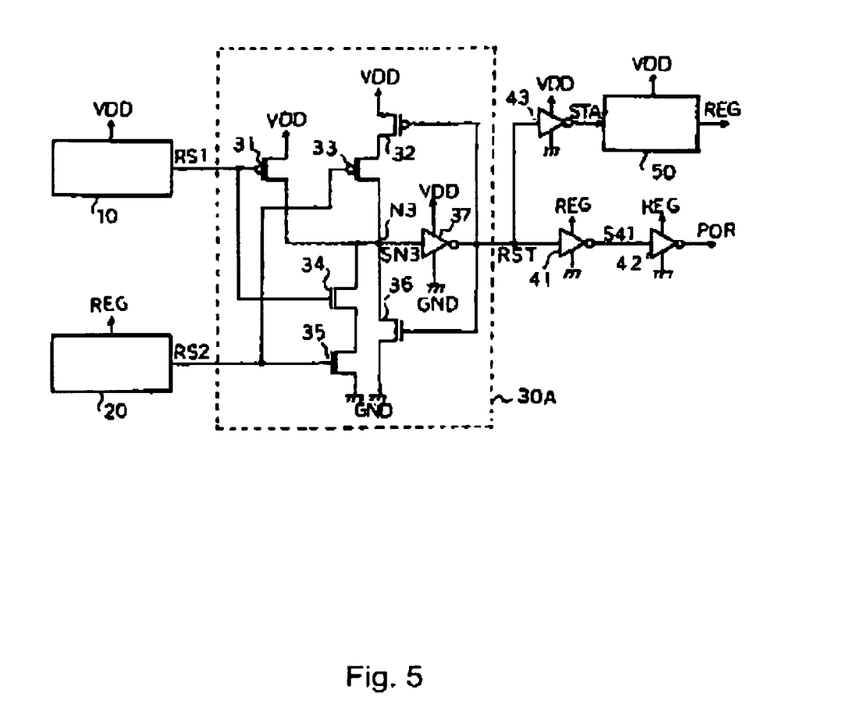
FIG. 5 is a configuration diagram of a power-on reset circuit illustrating a second exemplary embodiment of the present invention.

Referencing FIG. 5, a second exemplary power-on reset circuit includes a determination unit 30A slightly different from the determination unit 30 shown in FIG. 1. That is, the determination unit 30A includes an NMOS 36 whose conducting state is controlled by a reset signal RST, which is additionally provided between a node N3 and a ground potential GND. Incidentally, the dimensions of the NMOS 36 are set to not greater than one-half the dimensions of each of NMOSs 34 and 35. This is because since the NMOSs 34 and 35 are connected in series in two stages whereas the NMOS 36 assumes a one-stage configuration, current drive capacity simply reaches twice, and the NMOS 36 plays a subsidiary role for the NMOSs 34 and 35 and needs not have as much current drive capacity. The present embodiment is similar to FIG. 1 in other configuration.

Since the NMOS 36 is in an off state while the reset signal RST is "L" after turning on of the source voltage VDD, the present power-on reset circuit is exactly similar in operation to the power-on reset circuit of FIG. 1. Next, when the reset signal RST changes to "H", the NMOS 36 is turned on. Thus, a signal SN3 of the node N3 changes to "H" rapidly. Accordingly, the speed required to cause a power-on reset signal POR to rise can be increased.

Incidentally, the present invention is not limited to the above embodiments. Various modifications can be made thereto. As examples for the modifications, the following are brought about, for example.

(a) The configurations of the monitoring units 10 and 20 are not limited to ones illustrated in FIG. 1.

(b) A voltage regulator using a zener diode or the like can be used in place of the voltage regulator 50 that makes use of the start signal STA. In such a case, the inverter 43 for generating the start signal SRA becomes unnecessary.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A power-on reset circuit of a semiconductor integrated circuit, the semiconductor integrated circuit having a first internal circuit operated at a first source voltage supplied from outside the semiconductor integrated circuit and having the power-on reset circuit which supplies a power-on reset signal at startup thereof to a second internal circuit operated at a second source voltage generated from the first source voltage, the power-on reset circuit comprising:

a first monitoring unit configured to output a first monitoring signal when the first source voltage reaches a first predetermined level;

a second monitoring unit configured to output a second monitoring signal when the second source voltage reaches a second predetermined level;

a determination unit, which is operated at the first source voltage and is operatively coupled to outputs of the first and second monitoring units, configured to output a reset signal when the first and second monitoring signals are outputted respectively by the first and second monitoring units; and an output unit which is operated at the second source voltage and operatively coupled to an output of the determination unit, and configured to convert the reset signal to the level of the second internal source voltage and further configured to output the converted reset signal as the power-on reset signal, wherein the determination unit comprises:
a first P channel MOS transistor which is connected between the first source voltage and an internal node and whose gate terminal is operatively coupled to and controlled by the first monitoring signal output of the first monitoring unit;
second and third P channel MOS transistors which are connected in series between the first source voltage and the internal node and whose gate terminals are respectively operatively coupled to and controlled by the reset signal output of the determination unit and the second monitoring signal output of the second monitoring unit;
first and second N channel MOS transistors which are connected in series between the internal node and a ground potential and whose gate terminals are respectively operatively coupled to and controlled by the first and second monitoring signal outputs of the first and second monitoring units; and
an inverter having an input operatively coupled to the internal node and configured to output the reset signal by inverting a signal at the internal node.

2. The power-on reset circuit according to claim 1, wherein each of the gate widths of the first and second N channel MOS transistors is several times larger than the gate width of each of the first through third P channel MOS transistors.

3. The power-on reset circuit according to claim 2, wherein each of the gate widths of the first and second N channel MOS transistors is about twenty times larger than the gate width of each of the first through third P channel MOS transistors.

4. The power-on reset circuit according to claim 1, wherein the determination unit is provided with a third N channel MOS transistor connected between the internal node and the ground potential and whose gate terminal is operatively coupled to and controlled by the reset signal output of the determination unit.

5. The power-on reset circuit according to claim 4, wherein the third N channel MOS transistor is connected in parallel to the series connected, first and second N channel MOS transistors.

6. The power-on reset circuit according to claim 4, wherein the gate width of the third N channel MOS transistor is substantially less than the gate width of each of the first and second N channel MOS transistors.

7. The power-on reset circuit according to claim 6, wherein the gate width of the third N channel MOS transistor is less than or equal to half the gate width of each of the first and second N channel MOS transistors.

8. The power-on reset circuit according to claim 6, wherein each of the gate widths of the first and second N channel MOS transistors is several times larger than the gate width of each of the first through third P channel MOS transistors.

9. The power-on reset circuit according to claim 8, wherein each of the gate widths of the first and second N channel MOS transistors is about twenty times larger than the gate width of each of the first through third P channel MOS transistors.

10. The power-on reset circuit according to claim 9, wherein the gate width of the third N channel MOS transistor is less than or equal to half the gate width of each of the first and second N channel MOS transistors.

11. A determination circuit of a semiconductor integrated circuit, the semiconductor integrated circuit having a first internal circuit operated at a first source voltage supplied from outside the semiconductor integrated circuit and a second internal circuit operated at a second source voltage generated from the first source voltage, the determination circuit providing a reset signal upon first and second input signals on respective first and second input signal lines being active, the determination circuit comprising:
a first P channel MOS transistor which is connected between the first source voltage and an internal node and whose gate terminal is operatively coupled to and controlled by the first input signal line;
second and third P channel MOS transistors which are connected in series between the first source voltage and the internal node and whose gate terminals are respectively operatively coupled to and controlled by the reset signal output of the determination circuit and the second input signal line;
first and second N channel MOS transistors which are connected in series between the internal node and a ground potential and whose gate terminals are respectively operatively coupled to and controlled by the first and second input signal lines; and
an inverter having an input operatively coupled to the internal node and configured to output the reset signal by inverting a signal at the internal node.

12. The determination circuit according to claim 11, wherein each of the gate widths of the first and second N channel MOS transistors is several times larger than the gate width of each of the first through third P channel MOS transistors.

13. The determination circuit according to claim 12, wherein each of the gate widths of the first and second N channel MOS transistors is about twenty times larger than the gate width of each of the first through third P channel MOS transistors.

14. The determination circuit according to claim 11, further comprising a third N channel MOS transistor connected between the internal node and the ground potential and whose gate terminal is operatively coupled to and controlled by the reset signal output of the determination unit.

15. The determination circuit according to claim 14, wherein the third N channel MOS transistor is connected in parallel to the series connected, first and second N channel MOS transistors.

16. The determination circuit according to claim 14, wherein the gate width of the third N channel MOS transistor is substantially less than the gate width of each of the first and second N channel MOS transistors.

17. The determination circuit according to claim 16, wherein the gate width of the third N channel MOS transistor is less than or equal to half the gate width of each of the first and second N channel MOS transistors.

18. In a semiconductor integrated circuit, at startup of the semiconductor integrated circuit, a method for supplying a power-on reset signal to a second internal circuit operated at a second internal source voltage generated from a first source voltage supplied from outside the semiconductor integrated circuit, the method comprising the steps of:
monitoring the first source voltage and outputting a first monitoring signal when the first source voltage reaches a first predetermined level;
monitoring the second internal source voltage and outputting a second monitoring signal when the second internal source voltage reaches a second predetermined level;

providing a determination unit, which is operated at the first source voltage, and which outputs a reset signal when the first and second monitoring signals are outputted; and converting the reset signal to the level of the second internal source voltage and outputting the converted reset signal as the power-on reset signal, wherein the determination unit comprises:

a first P channel MOS transistor which is connected between the first source voltage and an internal node, wherein the operation of the determination unit includes a step of controlling conducting state of the first P channel MOS transistor by the first monitoring signal;

second and third P channel MOS transistors which are connected in series between the first source voltage and the internal node, wherein the operation of the determination unit includes the steps of controlling the conducting state of the second P channel MOS transistor by the reset signal and controlling the conducting state of the third P channel MOS transistor by the second monitoring signal; and first and second N channel MOS transistors which are connected in series between the internal node and a ground potential, wherein the operation of the determination unit includes the steps of controlling the conducting state of the first N channel MOS transistor with the first monitoring signal and controlling the conducting state of the second N channel MOS transistor with the second monitoring signal; and wherein the operation of the determination unit further includes the step of inverting a signal at the internal node to provide the reset signal.

19. The method of claim 18, wherein the determination unit further comprises a third N channel MOS transistor connected between the internal node and the ground potential and the operation of the determination unit includes the step of controlling the conducting state of the third N channel MOS transistor by the reset signal.

20. A power-on reset circuit of a semiconductor integrated circuit, the semiconductor integrated circuit having a first internal circuit operated at a first source voltage supplied from outside the semiconductor integrated circuit and having the power-on reset circuit which supplies a power-on reset signal at startup thereof to a second internal circuit operated at a second source voltage generated from the first source voltage, the power-on reset circuit comprising:

a first means for outputting a first monitoring signal when the first source voltage reaches a first predetermined level;

a second means for outputting a second monitoring signal when the second source voltage reaches a second predetermined level;

a determination unit, which is operated at the first source voltage and is operatively coupled to outputs of the first and second monitoring means, configured to output a reset signal when the first and second monitoring signals are outputted respectively by the first and second monitoring units; and an output unit which is operated at the second source voltage and operatively coupled to an output of the determination unit, and configured to convert the reset signal to the level of the second internal source voltage and further configured to output the converted reset signal as the power-on reset signal, wherein the determination unit comprises:

a first P channel MOS transistor which is connected between the first source voltage and an internal node and whose gate terminal is operatively coupled to and controlled by the first monitoring signal output of the first monitoring unit;

second and third P channel MOS transistors which are connected in series between the first source voltage and the internal node and whose gate terminals are respectively operatively coupled to and controlled by the reset signal output of the determination unit and the second monitoring signal output of the second monitoring unit;

first and second N channel MOS transistors which are connected in series between the internal node and a ground potential and whose gate terminals are respectively operatively coupled to and controlled by the first and second monitoring signal outputs of the first and second monitoring units; and an inverter having an input operatively coupled to the internal node and configured to output the reset signal by inverting a signal at the internal node.

* * * * *